（12) United States Patent
Hathaway et al.

(10) Patent No.: US 12,394,688 B2
(45) Date of Patent: Aug. 19, 2025

(54) SUPERCONDUCTING DEVICE INCLUDING SET OF CIRCUITS HAVING DIFFERENT OPERATIONAL TEMPERATURE REQUIREMENTS WITH MULTIPLE THERMAL SINKS AND MULTIPLE GROUND PLANES

(71) Applicant: NORTHROP GRUMMAN SYSTEMS CORPORATION, Falls Church, VA (US)

(72) Inventors: Aaron Ashley Hathaway, Baltimore, MD (US); Gregory R. Boyd, Washington, DC (US); John X. Przybysz, Severna Park, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 75 days.

(21) Appl. No.: 18/630,530

(22) Filed: Apr. 9, 2024

(65) Prior Publication Data

US 2024/0355701 A1  Oct. 24, 2024

Related U.S. Application Data

(60) Division of application No. 17/222,238, filed on Apr. 5, 2021, now Pat. No. 12,027,437, which is a
(Continued)

(51) Int. Cl.
*H01L 23/367* (2006.01)
*H01L 23/522* (2006.01)
(Continued)

(52) U.S. Cl.
CPC ........ *H01L 23/367* (2013.01); *H01L 23/5226* (2013.01); *H01L 23/5286* (2013.01);
(Continued)

(58) Field of Classification Search
CPC ............... H01L 23/367; H01L 23/5226; H01L 23/5286; H01L 23/53285;
(Continued)

(56) References Cited

U.S. PATENT DOCUMENTS 5,773,875 A   6/1998   Chan
5,780,314 A   7/1998   Chan
(Continued)

FOREIGN PATENT DOCUMENTS

CN      101599484      12/2009
EP      0883178 A2     12/1998
(Continued)

OTHER PUBLICATIONS

A. Arbouet, et al. Nonequilibrium Physics at Short Time Scales, 2004, pp. 357-358.
(Continued)

*Primary Examiner* — Khiem D Nguyen
(74) *Attorney, Agent, or Firm* — Tarolli, Sundheim, Covell & Tummino LLP

(57) ABSTRACT

An integrated circuit is provided that comprises a first thermal sink layer, a first ground plane associated with a first set of circuits that have a first operational temperature requirement, a first thermally conductive via that couples the first ground plane to the first thermal sink layer, a second thermal sink layer, a second ground plane associated with a second set of circuits that have a second operational temperature requirement that is higher than the first operational temperature requirement, and a second thermally conductive via that couples the second ground plane to the second thermal sink layer. The first thermal sink layer is cooled at a first temperature to maintain the first set of circuits at the first operational temperature requirement and the second thermal sink layer is cooled at a second temperature to
(Continued)

maintain the second set of circuits at the second operational temperature requirement.

11 Claims, 4 Drawing Sheets

Related U.S. Application Data continuation of application No. 16/227,965, filed on Dec. 20, 2018, now Pat. No. 11,004,763.

(51) Int. Cl.
    *H01L 23/528*     (2006.01)
    *H01L 23/532*     (2006.01)
    *H01L 23/66*     (2006.01)

(52) U.S. Cl.
    CPC ........ *H01L 23/53285* (2013.01); *H01L 23/66* (2013.01); *H01L 2223/6605* (2013.01); *H01L 2223/6683* (2013.01)

(58) Field of Classification Search
    CPC ............. H01L 2223/6683; H01L 23/66; H01L 23/3677; H01L 23/3736; H10N 69/00
    See application file for complete search history.

(56) References Cited

U.S. PATENT DOCUMENTS

| | | | |
|---|---|---|---|
| 5,897,367 A * | 4/1999 | Kerber | H10N 69/00 |
| | | | 257/30 |
| 6,246,583 B1 * | 6/2001 | Cronin | H01L 23/3677 |
| | | | 361/767 |
| 6,303,423 B1 | 10/2001 | Lin | |
| 6,528,732 B1 | 3/2003 | Okubora et al. | |
| 7,382,138 B1 | 6/2008 | Umans | |
| 9,153,863 B2 | 10/2015 | Nair et al. | |
| 9,368,479 B2 * | 6/2016 | Katkar | H01L 23/5386 |
| 9,836,699 B1 | 12/2017 | Rigetti et al. | |
| 9,871,034 B1 | 1/2018 | Or-Bach et al. | |
| 10,229,864 B1 | 3/2019 | Loney et al. | |
| 10,290,676 B2 | 5/2019 | Pesetski et al. | |
| 10,461,014 B2 * | 10/2019 | Lin | H01L 21/4882 |
| 10,629,535 B2 | 4/2020 | Loney et al. | |
| 10,727,162 B2 | 7/2020 | Loney et al. | |
| 2005/0254215 A1 * | 11/2005 | Khbeis | H01L 23/3677 |
| | | | 257/E23.105 |
| 2009/0102580 A1 | 4/2009 | Uchaykin | |
| 2010/0328913 A1 | 12/2010 | Kugler et al. | |
| 2011/0089405 A1 | 4/2011 | Ladizinsky et al. | |
| 2011/0215457 A1 * | 9/2011 | Park | H01L 25/50 |
| | | | 257/E23.101 |
| 2011/0290537 A1 | 12/2011 | Nagase | |
| 2011/0309513 A1 | 12/2011 | Biegelsen et al. | |
| 2012/0063097 A1 | 3/2012 | Reza et al. | |
| 2012/0217625 A1 | 8/2012 | Mohan et al. | |
| 2015/0119253 A1 | 4/2015 | Yohannes et al. | |
| 2017/0077069 A1 | 3/2017 | Danno et al. | |
| 2018/0102470 A1 | 4/2018 | Das et al. | |
| 2018/0247974 A1 | 8/2018 | Oliver et al. | |
| 2018/0294401 A1 | 10/2018 | Tuckerman | |
| 2019/0116670 A1 | 4/2019 | Anderson et al. | |
| 2019/0131246 A1 | 5/2019 | Loney et al. | |
| 2019/0157184 A1 | 5/2019 | Loney et al. | |
| 2020/0137885 A1 | 4/2020 | Flowers et al. | |
| 2020/0152540 A1 | 5/2020 | Nah et al. | |

FOREIGN PATENT DOCUMENTS

| | | |
|---|---|---|
| JP | H1032356 A | 2/1998 |
| JP | 2001330328 A | 11/2001 |
| JP | 2003188307 A | 7/2003 |
| JP | 2003273520 A | 9/2003 |
| JP | 2004152810 A | 5/2004 |
| JP | 2004158865 A | 6/2004 |
| JP | 2004349537 A | 12/2004 |
| JP | 2008172223 A | 7/2008 |
| JP | 2009295794 | 12/2009 |
| JP | 2012033567 | 2/2012 |
| JP | 2012519379 A | 8/2021 |
| KR | 20000021171 U | 12/2000 |
| KR | 20120018713 A | 3/2012 |
| KR | 20140070655 A | 6/2014 |
| KR | 20160031408 A | 3/2016 |
| KR | 20160122177 A | 10/2016 |
| WO | 2006132957 A2 | 12/2006 |
| WO | 2011109595 A1 | 9/2011 |

OTHER PUBLICATIONS

Wellstood, et al. "Hot electron effect in the DC Squid" IEEE Transactions on Magnetics, U.S., IEEE, Mar. 1989, vol. 25, Issue 2, pp. 1001-1004, DOI: 10.1109/20.92457.

* cited by examiner

SUPERCONDUCTING DEVICE INCLUDING SET OF CIRCUITS HAVING DIFFERENT OPERATIONAL TEMPERATURE REQUIREMENTS WITH MULTIPLE THERMAL SINKS AND MULTIPLE GROUND PLANES

RELATED APPLICATIONS

This application is a divisional application of U.S. patent application Ser. No. 17/222,238, filed 5 Apr. 2021, issued as U.S. Pat. No. 12,027,437, which claims priority from U.S. patent application Ser. No. 16/227,965, filed 20 Dec. 2018, issued as U.S. Pat. No. 11,004,763, which is incorporated herein in its entirety.

GOVERNMENT INTEREST

The invention was made under Government Contract Number 30078128. Therefore, the U.S. Government has rights to the invention as specified in that contract.

TECHNICAL FIELD

The present invention relates generally to integrated circuits, and more particularly to a superconducting device with multiple thermal sinks.

BACKGROUND

Monolithic Microwave Integrated circuit (MMIC) chips operating at cryogenic temperatures have superconducting circuits that need to be thermally managed by removing the heat from the superconducting circuits down towards the substrate. Under cryogenic temperature conditions, heat load, cooling resources, temperature, and circuit complexity are strongly tied to each other. Portions of devices on the MMIC need to be maintained at lower temperatures than other components which can operate at higher temperatures. This requires the entire MMIC to be held at the colder temperature. It is far more inefficient to lift one unit of power from cryogenic temperatures to room temperature than it is if that same power is lifted from a higher temperature to room temperature. As cryogenic chips become more and more complex, a greater number and greater variation of devices are populating the MMICs. Each of these devices can have different operational temperature requirements.

A typical cryogenic MMIC consists of a silicon substrate topped with alternating layers of electrically conducting material and dielectric. Multiple device types can exist in the MMIC. As an example, a MMIC may have three different device types that need to run at three different operating temperatures. For example, a first device may need to operate below 500 millikelvin (mK), a second device may need to operate below 1 Kelvin (K), and a third device may need to operate below 4 K. With a single ground plane, the entire mesh layer will be at a near uniform temperature. This is due to the ability of the electrically conducting material to transport (spread) the heat laterally in the X and Y directions. Therefore, if all devices are connected to this ground plane, all will have to be maintained to the most stringent operating requirement, for example, 500 mK. That is since the third device only needs to be kept at 4 K, but is instead maintained at 0.5 K (8 times lower temperature), then more than 8 times the cooling resources are needed to manage this sector of the MMIC.

SUMMARY

In one example, an integrated circuit is provided that comprises a first thermal sink layer, a first ground plane associated with a first set of circuits that have a first operational temperature requirement, and a first thermally conductive via that couples the first ground plane to the first thermal sink layer. The integrated circuit also comprises a second thermal sink layer, a second ground plane associated with a second set of circuits that have a second operational temperature requirement that is higher than the first operational temperature requirement, and a second thermally conductive via that couples the second ground plane to the second thermal sink layer. The first thermal sink layer is cooled at a first temperature to maintain the first set of circuits at the first operational temperature requirement and the second thermal sink layer is cooled at a second temperature to maintain the second set of circuits at the second operational temperature requirement.

In another example, a monolithic microwave integrated circuit (MMIC) is provided that comprises a first electrically conducting ground plane associated with a first set of superconducting circuits that have a first operational temperature requirement, a second electrically conducting ground plane associated with a second set of superconducting circuits that have a second operational temperature requirement that is higher than the first operational temperature requirement, a first thermal sink layer disposed one of above or below the first and second electrically conducting ground planes, and a second thermal sink layer disposed the other of above or below the first and second electrically conducting ground planes. The MMIC further comprises a first set of thermally conductive vias that each couple the first electrically conducting ground plane to the first thermal sink layer through the substrate, and a second set of thermally conductive vias that each couple the second ground plane to a second thermal sink layer.

In yet another example, an integrated circuit is provided that comprises a plurality of thermal sink layers with each thermal sink layer being thermally isolated from each other thermal sink layer; and a plurality of ground planes each being associated with a respective set of circuits that each have a differential operational temperature requirement than the other. Each of the plurality of ground planes are coupled to a respective thermal sink layer by a respective thermal via, wherein each thermal sink layer is cooled at a respective temperature to maintain its coupled ground plane at its respective operational temperature requirement.

DETAILED DESCRIPTION

The present disclosure describes an integrated circuit (e.g., Monolithic Microwave Integrated circuit (MMIC)) that includes separate dedicated ground planes for sets of circuits that run at different operating temperature requirements. Each separate ground plane is coupled to a respective thermal sink layer by one or more associated thermal vias (contacts). Each thermal sink layer can be cooled at a given temperature appropriately in a cooling temperature zone to allow for adequate heat sinking from respective separate ground planes to maintain the respective sets of circuits at their desired operating temperature requirement. In this manner, each thermal sink layer does not need to be held at the lowest temperature to maintain an operational requirement, but only its respective operational temperature requirement, such that the necessary power to refrigerate the entire device is reduced.

Certain examples will be illustrated with respect to electrically conducting ground planes and associated superconducting circuits with different operational temperature requirements. However, other examples can include mixture of electrically conducting ground planes and associated superconducting circuitry and non-superconducting ground planes and associated circuitry, or a mixture of non-superconducting circuitry and associated circuitry with different operational temperature requirements.

Figure 1:
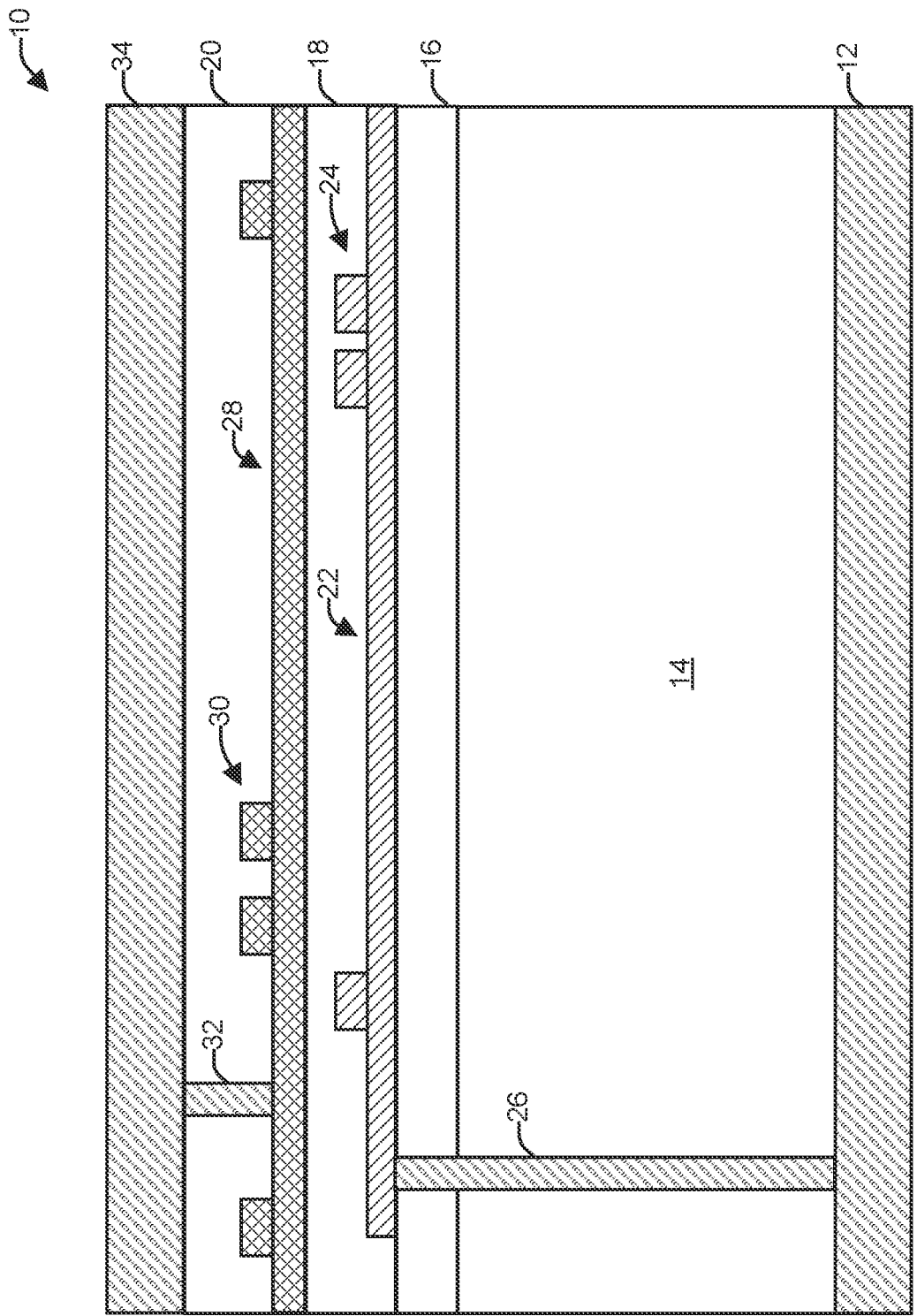
FIG. 1 illustrates a cross-sectional view of a portion of an example integrated circuit.

FIG. 1 illustrates cross-sectional view of an example of a portion of an integrated circuit 10. The portion of the integrated circuit 10 includes a first dielectric layer 16 overlying a substrate 14, a second dielectric layer 18 overlying the first dielectric layer 16, and a third dielectric layer 20 overlying the second dielectric layer 18. The substrate 14 can be formed of silicon, glass or other substrate material. A first thermal sink layer 12 resides at a bottom of the substrate 14, and a second thermal sink layer 34 resides on a top surface of the integrated circuit 10. The first dielectric layer 16 provides a buffer layer between the substrate and the active circuits of the integrated circuit 10. A first electrically conducting ground plane 22 and a first set of superconducting circuits 24 are disposed in the second dielectric layer 18, and a second electrically conducting ground plane 28 and a second set of circuits 30 resides in the third dielectric layer 20. The first electrically conducting ground plane 22 and the first set of superconducting circuits 24 have a first operating temperature requirement and the second electrically conducting ground plane 28 and a second set of superconducting circuits 30 have a second operating temperature requirement.

The first operating temperature requirement is different and lower than the second operating temperature requirement, which makes the second operating temperature requirement higher than the first operating temperature requirement. The term operating temperature requirement refers to an operating temperature that a circuit material of a ground plane and set of circuits needs to operate at or below to maintain their properties. For example, the first electrically conducting ground plane and a first set of superconducting circuits may include the utilization of Aluminum, which needs to maintain an operating temperature of at or below 500 milliKelvin for proper operation, while the second electrically conducting ground plane and a second set of circuits may include the utilization of Niobium, which needs to maintain an operating temperature of at or below 4.2 Kelvin for proper operation. That means a set of circuits with a lower operating temperature requirement needs more cooling resources per watt of dissipated power than a set of circuits with a higher operating temperature requirement.

A first thermal via 26 connects the first electrically conducting ground plane 22 to the first thermal sink layer 12, and a second thermal via 32 connects the second electrically conducting ground plane 28 to the second thermal sink layer 34. The first thermal sink layer 12 and the second thermal sink layer 34 are both formed of a thermal conductive material. A thermal conductive material is a material that is a relatively good thermal conductor, such that it readily transfers heat. A superconductive material is a good electrically conductive material but a poor thermal conductive material (compared to a normal metal that is not superconducting). Therefore, neither the first thermal sink layer 12 or the second terminal sink layer 34 are formed of a superconductive material. Additionally, the first thermal via 26 and the second thermal via 32 can be formed of a thermal conductive material. That is a material that is relatively good at conducting heat from the electrically conducting ground layers to the respective thermal sink layers. The first thermal sink layer 12 can be cooled in a first cooling temperature zone by a first external cooling source to hold the first thermal sink layer 12 at or below a first temperature, and the second thermal sink layer 34 can be cooled in a second cooling temperature zone by a second external cooling source to hold the second thermal sink layer 34 at or below a second temperature that is higher than the first temperature. The first external source and the second external source can be from different cooling devices, or different stages of the same cooling device. In one example, the first thermal sink layer 12, the second thermal sink layer 34, the first thermal via 26 and the second thermal via 32 are all formed of copper. Alternative examples of thermally conductive materials include gold, silver, tungsten, molybdenum, iridium, and rhodium.

Dielectric layer 18 must be thick enough to prevent coupling between phonons in layer 28 and phonons in layers 22 and 24. The minimum thickness for decoupling these layers is set by the dominant phonon wavelength in dielectric 18 at the lower operating temperature in the circuits of layer 24. To prevent direct coupling between these layers, dielectric layer 18 should be thicker than 4 phonon wavelengths. For example, in silicon dioxide the dominant phonon wavelength at 500 mK is 21 nanometers, so a dielectric layer 18 made of silicon dioxide should be at least 84 nanometers thick. When dielectric layer 18 is thick, the thermal boundary resistance between metals and dielectrics will minimize heat flow between the metal layers. Phonons in metals do not match well to phonons in dielectrics. This acoustic boundary resistance is a significant barrier to heat flow from layer 28 into layer 18 and from layer 18 into layers 22 and 24. A sufficiently thick dielectric layer 18 eliminates coupling between evanescent metal layer phonon waves and prevents phonons from hopping across the dielectric barrier.

Therefore, the temperature of the first electrically conducting ground plane 22 and first set of superconducting circuits 24 can be maintained at a lower temperature than the second electrically conducting ground plane 28 and second set of superconducting circuits 30 by using different thermal sink layers held at different temperature at different cooling temperature zones by different cooling sources. The first thermal sink layer 12 can be cooled to a temperature that can be at or below the first operating temperature requirement to maintain the first electrically conducting ground plane 22 and the first set of superconducting circuits 24 at the first operating temperature requirement, and the second thermal sink layer 12 can be cooled to a temperature that can be at or below the second operating temperature requirement to maintain the second electrically conducting ground plane 28 and the second set of superconducting circuits 30 at the second operating temperature requirement.

Although FIG. 1 illustrates a single first thermal via 26 and a single second thermal via 32, there can be a greater number of first thermal vias and second thermal vias to maintain the temperature of the first electrically conducting ground plane 22 and the first set of superconducting circuits 24 at or below the first operating temperature requirement, and the second electrically conducting ground plane 28 and the second set of superconducting circuits 30 at or below the second operating temperature requirement.

Figure 2:
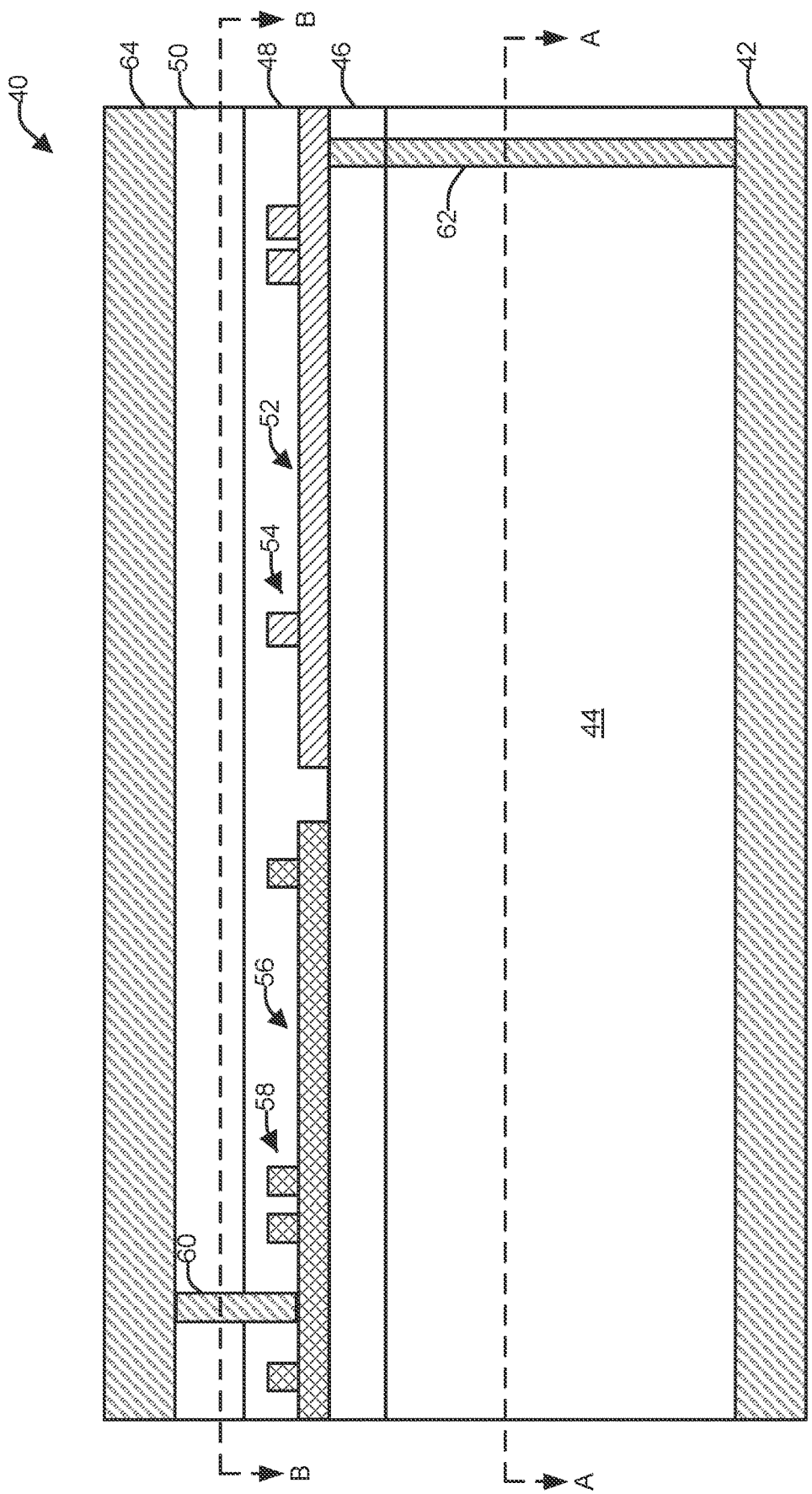
FIG. 2 illustrates a cross-sectional view of a portion of another example integrated circuit.

FIG. 2 illustrates cross-sectional view of portion of another example integrated circuit 40. The portion of the integrated circuit 40 includes a first dielectric layer 46 overlying a substrate 44, a second dielectric layer 48 overlying the first dielectric layer 46, and a third dielectric layer 50 overlying the second dielectric layer 48. The substrate 44 can be formed of silicon, glass or other substrate material. A first thermal sink layer 42 resides at a bottom of the substrate 44, and a second thermal sink layer 64 resides on a top surface of the integrated circuit 40. The first dielectric layer 46 provides a buffer layer between the substrate 44 and the active circuits of the integrated circuit 40. A first electrically conducting ground plane 52 and a first set of superconducting circuits 54 are disposed in the second dielectric layer 48, and a second electrically conducting ground plane 56 and a second set of circuits 58 are disposed in the second dielectric layer 48 in an adjacent relationship to first electrically conducting ground plane 52 and the first set of superconducting circuits 54. The first electrically conducting ground plane 52 and the first set of superconducting circuits 54 have a first operating temperature requirement and the second electrically conducting ground plane 56 and a second set of superconducting circuits 58 have a second operating temperature requirement.

In this example, the first operating temperature requirement is different and lower than the second operating temperature requirement, such that the second operating temperature requirement is higher than the first operating temperature requirement similar to the example in FIG. 1. The first electrically conducting ground plane 52 and the first set of superconducting circuits 54 may include the utilization of Aluminum, which needs to maintain an operating temperature of at or below 500 milliKelvin for proper operation, while the second superconducting ground plane 56 and the second set of superconducting circuits 58 may include the utilization of Niobium, which needs to maintain an operating temperature of at or below 4 Kelvin for proper operation.

A first set of thermal vias 62 connects the first electrically conducting ground plane 52 to the first thermal sink layer 42, and a second set of thermal vias 60 connects the second electrically conducting ground plane 56 to the second thermal sink layer 64. The first thermal sink layer 42 and the second thermal sink layer 64 are formed of a thermal conductive material. Additionally, the first set of thermal vias 62 and the second set of thermal vias 60 can be formed of a thermal conductive material. In one example, the first thermal sink layer 42, the second thermal sink layer 64, the first set of thermal vias 62 and the second set of thermal vias 60 are all formed of copper.

The first thermal sink layer 42 can be cooled in a first cooling temperature zone by a first external cooling source to hold the first thermal sink layer 42 at or below a first temperature, and the second thermal sink layer 64 can be cooled in a second cooling temperature zone by a second external cooling source to hold the second thermal sink layer 64 at or below a second temperature that is higher than the first temperature. Again, the first external source and the second external source can be from different cooling devices, or different stages of the same cooling device.

Figure 3:
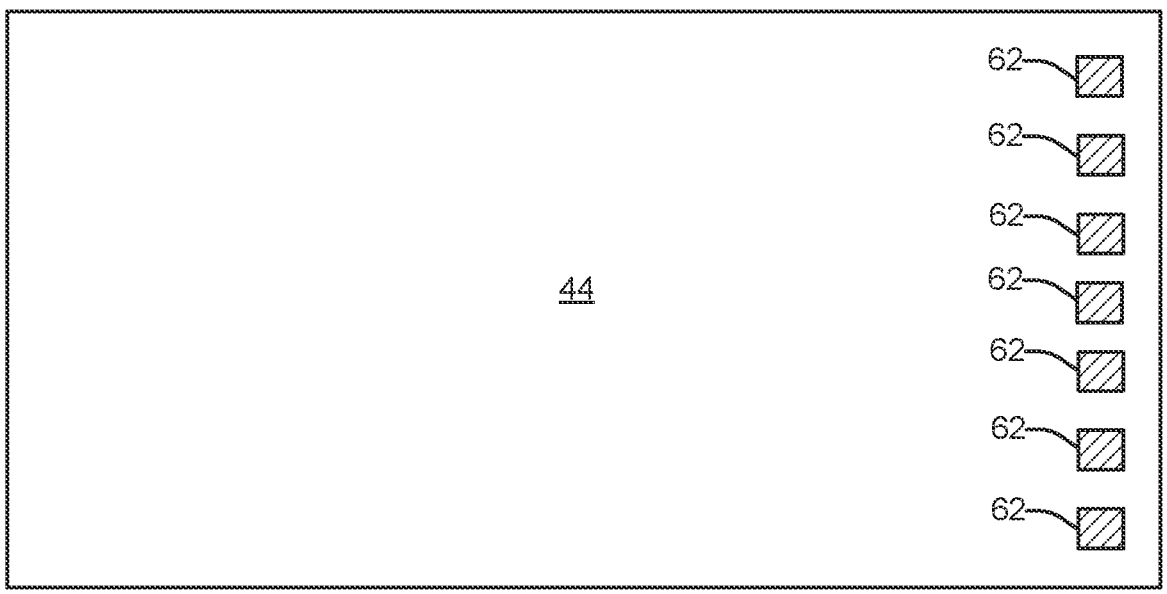
FIG. 3 illustrates a cross-sectional view of the portion of the integrated circuit along the lines A-A of FIG. 2.
Figure 4:
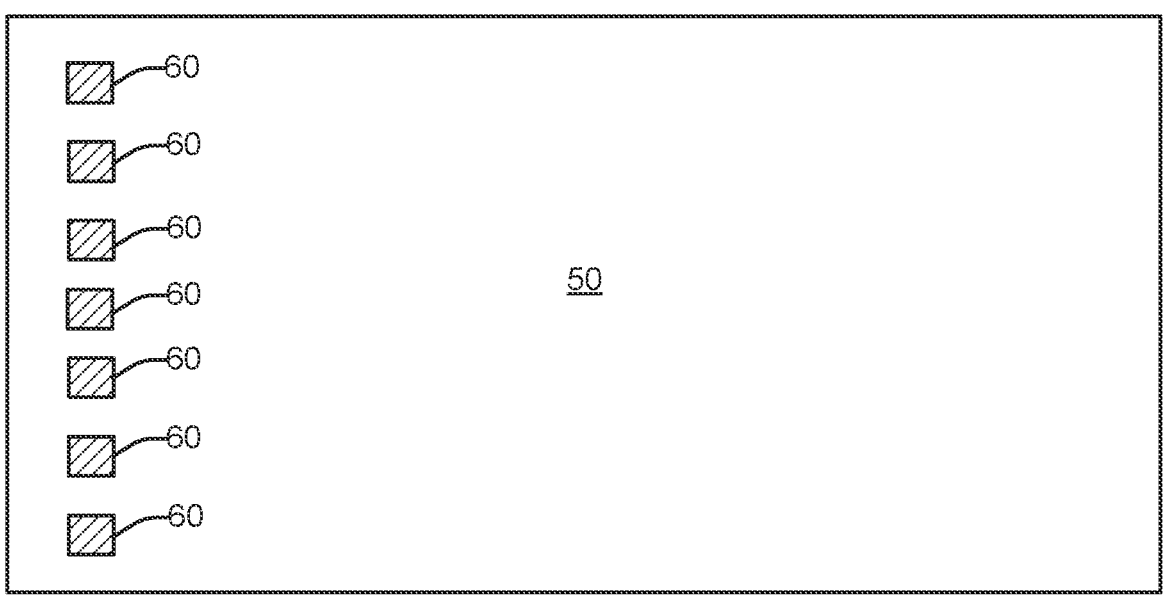
FIG. 4 illustrates a cross-sectional view of the portion of the integrated circuit along the lines B-B of FIG. 2.

FIG. 3 illustrates a cross-sectional view of the portion of the integrated circuit 40 along the lines A-A. FIG. 4 illustrates a cross-sectional view of the portion of the integrated circuit 40 along the lines B-B. As illustrated in FIGS. 3-4, the cross section of thermally conductive material associated with the first set of thermal vias 62 is the same as the cross section of thermally conductive material associated with the second set of thermal vias 60. However, based on a desired design and cooling requirements the number and size of the thermal vias for either or both of the first and second set of thermal vias can be varied to achieve the desired cooling requirements as efficiently as possible.

The examples of FIGS. 1-4 illustrate integrated circuits utilizing two different thermal sink layers subjected to two different temperature cooling zones to maintain circuits and ground planes with two different operating temperature requirements at or below their respective desired temperatures without subjecting the entire integrated circuit to the lowest temperature requirement thus saving the necessary energy required to maintain proper operation of all circuits in the integrated circuit. However, other examples can include more than two cooling temperature zones and associated thermal sink layers to maintain proper operation of circuits with three or more different operating temperature requirements based on practical limitations.

Figure 5:
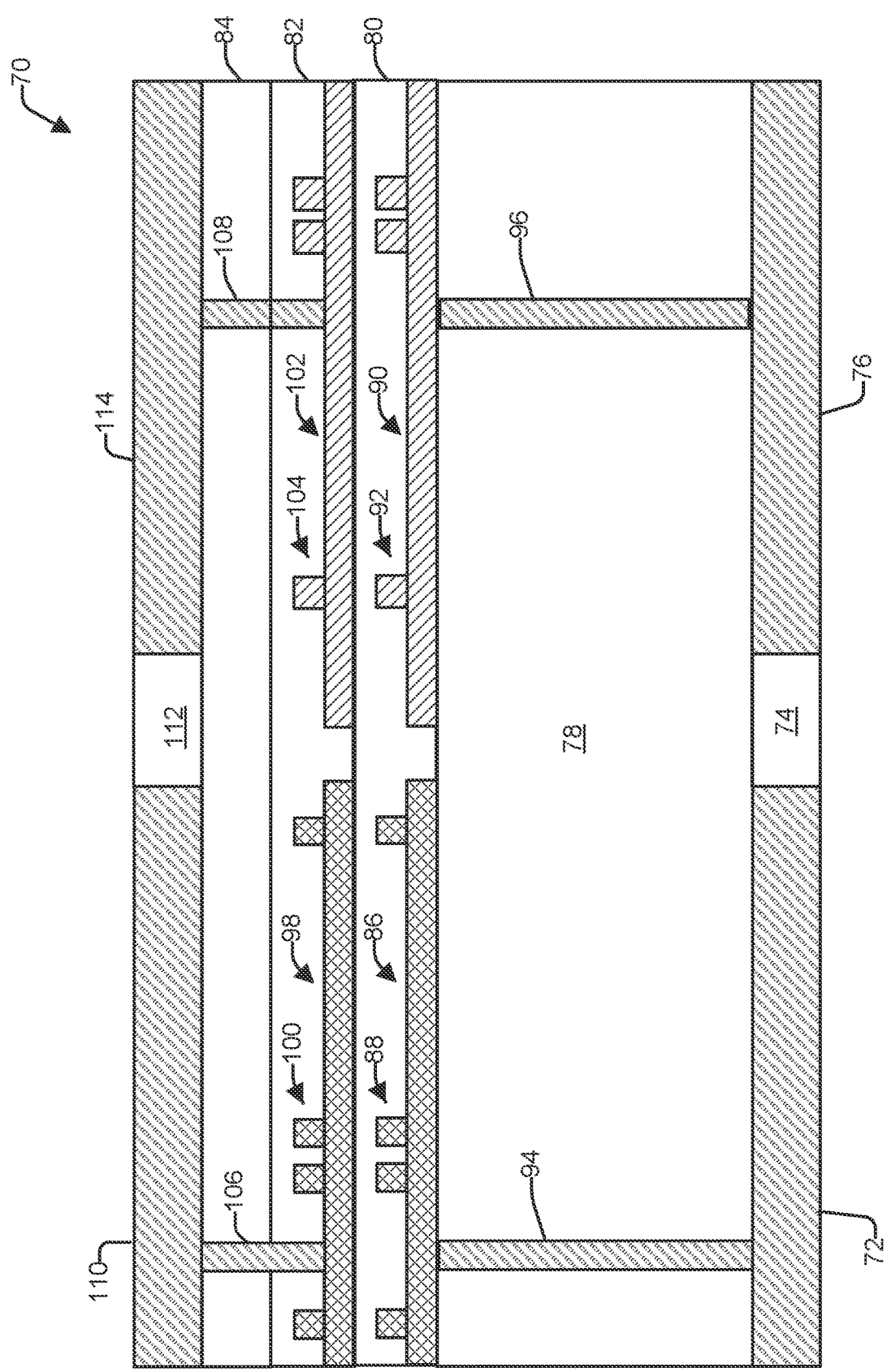
FIG. 5 illustrates a cross-sectional view of a portion of yet another example integrated circuit.

FIG. 5 illustrates a cross-sectional view of a portion of yet another example of an integrated circuit 70. The portion of the integrated circuit 70 includes a first dielectric layer 80 overlying a substrate 78, a second dielectric layer 82 overlying the first dielectric layer 80, and a third dielectric layer 84 overlying the second dielectric layer 82. The substrate 78 can be formed of silicon, glass or other substrate material. A first thermal sink layer 72 resides at a first side at a bottom of the substrate 78, and a second thermal sink layer 76 resides at a second side at the bottom of the substrate 78 separated from one another by a separation region 74 that can be, for example, an insulation region. A first electrically conducting ground plane 86 and a first set of circuits 88 are disposed in the first dielectric layer 80, and a second electrically conducting ground plane 90 and a second set of circuits 92 resides in the first dielectric layer 80 in an adjacent relationship to first electrically conducting ground plane 86 and the first set of circuits 88. The first electrically conducting ground plane 86 and the first set of circuits 88 have a first operating temperature requirement and the second electrically conducting ground plane 90 and the second set of circuits 92 have a second operating temperature requirement.

A third thermal sink layer 110 resides at a first side at a top surface of the integrated circuit 70, and a fourth thermal sink layer 114 resides at a second side at the top surface of the integrated circuit 70 separated from one another by a separation region 112 that can be, for example, an insulation region. A third electrically conducting ground plane 98 and a third set of circuits 100 are disposed in the second dielectric layer 82, and a fourth electrically conducting ground plane 102 and a fourth set of circuits 104 resides in the second dielectric layer 82 in an adjacent relationship to third electrically conducting ground plane 98 and the third set of circuits 100. The third electrically conducting ground plane 98 and the third set of circuits 100 have a third operating temperature requirement and the fourth electrically conducting ground plane 102 and the fourth set of circuits 104 have a fourth operating temperature requirement.

A first thermal via 94 connects the first electrically conducting ground plane 86 to the first thermal sink layer 72, and a second thermal via 96 connects the second electrically conducting ground plane 90 to the second thermal sink layer 76. Additionally, a third thermal via 106 connects the third electrically conducting ground plane 98 to the third thermal sink layer 110, and a fourth thermal via 108 connects the fourth electrically conducting ground plane 102 to the fourth thermal sink layer 114. Each of the thermal sink layers are formed of a thermal conductive material. The first thermal sink layer 72 can be cooled in a first cooling temperature zone by a first external cooling source to hold the first thermal sink layer 72 at or below a first temperature, and the second thermal sink layer 76 can be cooled in a second cooling temperature zone by a second external cooling source to hold the second thermal sink layer 76 at or below a second temperature that is higher than the first temperature.

Furthermore, the third thermal sink layer 110 can be cooled in a third cooling temperature zone by a third external cooling source to hold the third thermal sink layer 110 at or below a third temperature, and the fourth thermal sink layer 114 can be cooled in a fourth cooling temperature zone by a fourth external cooling source to hold the fourth thermal sink layer 114 at or below a fourth temperature. Each thermal sink layer is thermally isolated from the other thermal sink layers. Each of the first temperature, the second temperature, the third temperature and the fourth temperature are different from one another. The first external source, the second external source, the third external source and the fourth external source can each be from different cooling devices, or different stages of the same cooling device. Additionally, each of the first set of circuits, the second set of circuits, the third set of circuits and the fourth set of circuits can be one of superconducting circuits or non-superconducting circuits, such that the integrated circuit can include both conventional circuits running at one or more different temperature requirements and superconducting circuits running at one or more different temperature requirements.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A circuit comprising:
   a first dielectric layer comprising a first electrically conducting ground plane and a first set of circuits that have a first operational temperature requirement, the first dielectric layer further comprising a second electrically conducting ground plane and a second set of circuits that have a different operational temperature requirement than the first electrically conducting ground plane and the first set of circuits;
   a second dielectric layer comprising a third electrically conducting ground plane and a third set of circuits that have a third operational temperature requirement, the second dielectric layer further comprising a fourth electrically conducting ground plane and a fourth set of circuits that have a different operational temperature requirement than the third electrically conducting ground plane and the third set of circuits;
   a plurality of thermal sink layers; and
   a plurality of conductive vias,
   wherein at least one conductive via of the plurality of conductive vias couples one of the first, second, third, and fourth electrically conducting ground planes to one of the plurality of thermal sink layers.

2. The circuit of claim 1, wherein each thermal sink layer of the plurality of thermal sink layers is cooled at a different temperature to maintain the first, second, third, and fourth set of circuits at different operational temperatures.

3. The circuit of claim 1, wherein the first electrically conducting ground plane and the first set of circuits are adjacent to and physically separated from the second electrically conducting ground plane and the second set of circuits.

4. The circuit of claim 3, wherein the third electrically conducting ground plane and the third set of circuits are adjacent to and physically separated from the fourth electrically conducting ground plane and the fourth set of circuits.

5. The circuit of claim 1, wherein the plurality of thermal sink layers comprises:
   a first thermal sink layer;
   a second thermal sink layer;
   a third thermal sink layer; and
   a fourth thermal sink layer.

6. The circuit of claim 5, wherein the first thermal sink layer and the second thermal sink layer are separated by a first separation region, and the third thermal sink layer and the fourth thermal sink layer are separated by a second separation region.

7. The circuit of claim 6, wherein the plurality of conductive vias comprises:
   a first conductive via;
   a second conductive via;
   a third conductive via; and
   a fourth conductive via.

8. The circuit of claim 7, wherein the first conductive via couples the first electrically ground plane to the first thermal sink layer, the second conductive via couples the second electrically ground plane to the second thermal sink layer, the third conductive via couples the third electrically ground plane to the third thermal sink layer, and the fourth conductive via couples the fourth electrically ground plane to the fourth thermal sink layer.

9. The circuit of claim 1, wherein the plurality of thermal sink layers and the plurality of conductive vias are formed of copper.

10. The circuit of claim 1, wherein the first, second, third, and fourth set of circuits correspond to first, second, third, and fourth set of superconducting circuits.

11. The circuit of claim 1, wherein the circuit is a Monolithic Microwave Integrated circuit.

* * * * *